United States Patent [19]
Olschewski

[11] 4,103,267
[45] Jul. 25, 1978

[54] HYBRID TRANSFORMER DEVICE

[75] Inventor: Wilfred W. Olschewski, Tucson, Ariz.

[73] Assignee: Burr-Brown Research Corporation, Tucson, Ariz.

[21] Appl. No.: 806,053

[22] Filed: Jun. 13, 1977

[51] Int. Cl.² .............. H01F 15/02; H01F 27/30
[52] U.S. Cl. ...................... 336/65; 29/606; 29/626; 336/200; 336/229; 361/400
[58] Field of Search .......... 336/200, 229, 223, 65, 336/228; 361/400, 403; 29/606, 626

[56] References Cited

U.S. PATENT DOCUMENTS

| | | | |
|---|---|---|---|
| 3,238,484 | 3/1966 | Dacey | 336/228 X |
| 3,477,051 | 11/1969 | Clark et al. | 336/200 X |
| 3,483,495 | 12/1969 | Clark et al. | 336/200 X |
| 3,659,240 | 4/1972 | Learned et al. | 336/200 |
| 3,798,059 | 3/1974 | Astle et al. | 336/200 X |

FOREIGN PATENT DOCUMENTS 2,279,307  2/1976  France .................. 361/400

*Primary Examiner*—Thomas J. Kozma
*Attorney, Agent, or Firm*—Cahill, Sutton & Thomas

[57] ABSTRACT

A ceramic substrate is provided with a plurality of planar conductors formed on a surface of the substrate; conductors extend substantially radially from an imaginary point on the surface of the substrate. A layer of dielectric material is formed over the major portion of each of the conductors to form a ring of dielectric material to which a ferrite toroidal core is adhesively secured. The core is precoated with an insulating material prior to adhesively being secured to the dielectric ring. A plurality of wire conductors are wire bonded at each end thereof to the exposed ends of the metal conductors on the substrate.

18 Claims, 4 Drawing Figures

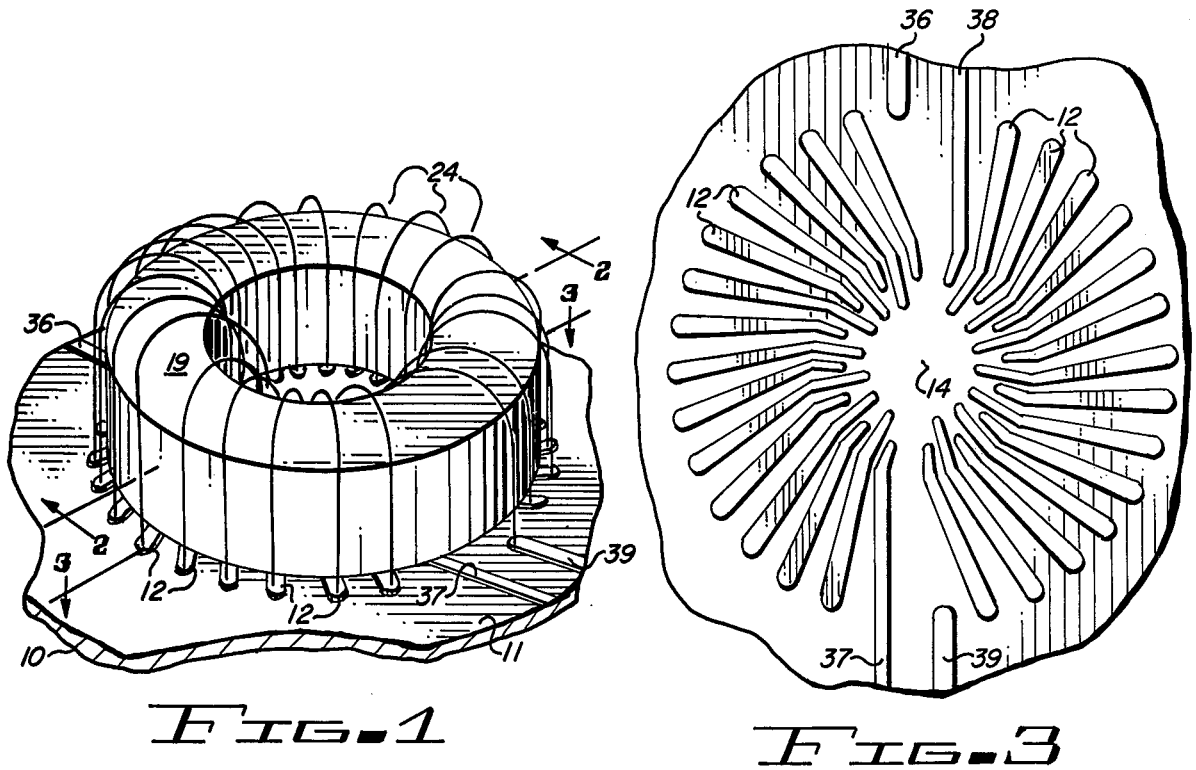
FIG.-1
FIG.-3
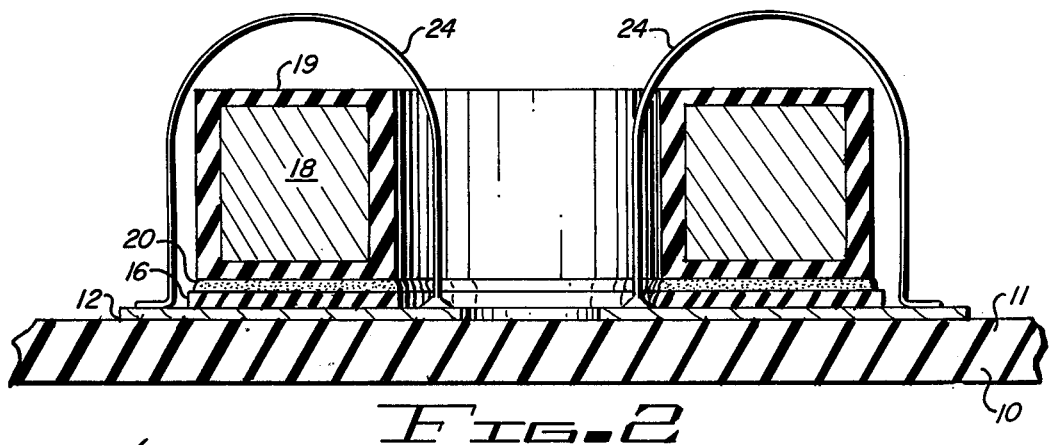
FIG.-2
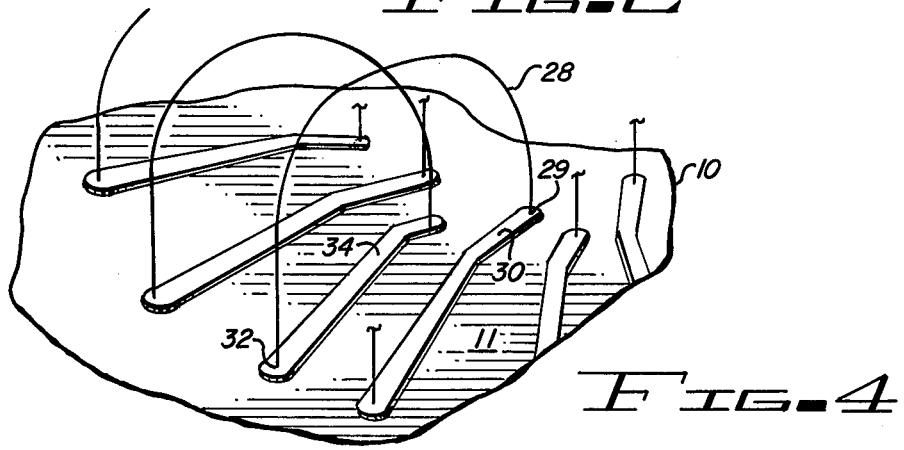
FIG.-4

HYBRID TRANSFORMER DEVICE

The present invention pertains to transformers, and more particularly, to transformers of the type suitable for utilization in hybrid integrated circuit environments.

It has been found generally difficult to use miniature transformers in hybrid integrated circuit assemblies. The bulk inherent in such transformers created by the magnet wire, the large wire lead location tolerances required, and the difficulty in connecting the wire leads to the circuit chip result in high manufacturing cost and an unsatisfactory integrated circuit package.

The prior art has suggested many techniques for overcoming the difficulties encountered when inductances are to be incorporated in solid state circuit devices. For example, U.S. Pat. Nos. 3,305,814 — Moyer, 3,659,240—Learned, and 3,858,138—Gittleman et al, each disclose the use of deposition techniques to derive appropriate inductances or to derive a transformer structure using multiple layers of magnetic material. While each of these references provides a usable device for the particular applications involved, they effectively eliminate the use of commonly available closed magnetic loop cores such as toroidal ferrite cores having large cross-sectional areas. This latter statement is particularly true in those instances where the circuit requirements dictate a high inductance value or are intended for power applications wherein deposited film layers of magnetic material are not appropriate. In many instances, it is desirable to utilize a transformer in an integrated circuit environment which may be formed from a tape-wound laminated core that, while not having any air gaps in the magnetic path, may be non-toroidal in shape. To replace such ferrite toroidal cores or non-toroidal cores of ferrite or laminated materials with layered deposited magnetic material would not provide the necessary inductance or power handling capabilities required for many integrated circuit applications.

It is therefore an object of the present invention to provide a hybrid transformer device that is compatible with hybrid integrated circuit structure, but still provides performance levels similar to that of discrete transformer devices.

It is another object of the present invention to provide a hybrid transformer device that is more readily manufacturable and therefore less expensive to produce without degradation in power handling capability.

It is still another object of the present invention to provide a hybrid transformer device that is less bulky, less expensive, and nevertheless compatible with hybrid integrated circuit structures.

These and other advantages will become apparent to those skilled in the art as the description thereof proceeds.

Briefly, in accordance with the embodiment chosen for illustration, a ceramic substrate is provided with a plurality of planar conductors which are formed of metallized strips on ceramic substrate. A dielectric glass material is formed over the conductors leaving only the exposed ends of the conductors available for connection to an electric circuit. A sintered ferrite toroidal core is precoated with insulating material and is adhesively secured to the dielectric layer. A plurality of wire conductors are wire bonded at one end to an exposed end of the metallized conductors on the surface of the substrate. The wire conductor is then looped over the toroid and secured at the opposite end of the wire conductor to the exposed end of an adjacent metallized conductor to form a loop of a transformer winding.

The present invention may more readily be described by reference to the accompanying drawings in which:

FIG. 1 is a perspective view of a typical hybrid transformer device constructed in accordance with the teachings of the present invention.

FIG. 2 is a cross-sectional view of the device of FIG. 1 taken along line 2—2.

FIG. 3 is a top view of the device of FIG. 1 taken along line 3—3 with the toroidal core and wire conductors removed to show the pattern of the flat conductors formed by metallization on the substrate.

FIG. 4 is a perspective view of a portion of FIG. 1 with the toroidal core removed showing the interconnection of selected wire conductors with corresponding flat conductors.

Referring now to the drawings, a hybrid transformer constructed in accordance with the teachings of the present invention will be described in terms of a typical ferrite toroid. A substrate 10 that in most integrated circuit applications will be formed of a ceramic material, includes a planar surface 11 which forms the basis for receiving a plurality of metal conductors 12. The conductors 12 are formed through the utilization of conventional metallization techniques commonly used in integrated circuit manufacturing processes. The metal conductors 12 may be formed, for example, with a screen printing paste that is fire-formed to provide a metallized layer in the desired shape and design. Metallization may be formed utilizing a screen printing paste manufactured and sold by EMCA known by their designation as 212B. The resulting metal conductors 12 are of gold base. Gold or other precious metal conductors have generally been utilized in integrated circuit environments requiring attachment to wire conductors in view of the bonding techniques generaly available; however, the conductors 12 may be formed of nonprecious metals if other connection techniques are used besides the typical wire bonding process.

It may be noted in FIG. 3 that the conductors 12 each have a predetermined length and extend generally radially from an imaginary point 14 on the surface of the substrate 10. The radial configuration of the conductors 12 is dictated by the shape of the transformer core as will be described more fully hereinafter. A layer of dielectric material 16 is formed over the conductors 12 and covers the major portion of each of the conductors; that is, the dielectric layer 16 will leave the inner and outer ends of the conductors 12 exposed while providing an electric insulating layer for a "washer" shaped area covering the intermediate lengths of each of the conductors 12.

The dielectric layer 16 may be formed of a typical dielectric layer utilized for passivation in integrated circuit technology. For example, the layer can conveniently be formed using a thick film glass paste readily available from DuPont and designated as their glass paste no. 9841. This latter paste provides the added advantage of a high dielectric strength which may be desirable in some applications of the present apparatus.

A toroidal ferrite core 18 is precoated with an insulating material indicated generally at 19 and is mounted on the dielectric layer 16 through the expediency of an adhesive material 20. It has been found that the adhesive material 20 should be a relatively yieldable or soft adhesive over complete operating temperatue range such as a silicone adhesive or some polyurethane adhesives;

many epoxy materials are not suitable in all applications and have been found to restrict the magnetostrictive dimensional changes of the core 18. Alternatively, sufficient insulation may be provided by the adhesive material 20 in some instances to thereby eliminate the need for the step to form the layer 16.

A plurality of metal wire conductors 24 are placed over the core 18 and are bonded through wire bonding techniques at either end to the ends of the metal conductor 12. The interconnection of the metal wire conductors 24 and the metal conductors 12 may best be described by reference to FIG. 4. Wire conductor 28 is shown bonded at one end 29 thereof to the flat metal conductor 30 formed by the previously described metallization technique on the surface 11 of the substrate 10. The opposite end 32 of the wire 28 is wire bonded to the metal conductor 34. Conductor 34 is adjacent conductor 31 and the wire conductor 28 is bonded to the radially outward end of the conductor 34 and to the radially inward end of the conductor 30. In this manner, windings are formed over the toroidal core 18 and a continuous electrical path is formed around the toroid to form primary and secondary windings of the hybrid transformer.

The array of conductor 12 as shown in FIG. 3, facilitates the formation of a single primary and a single secondary winding. That is, conductors 36 and 37 form the electrical inputs to the winding formed by the left hand conductors of FIG. 3, while conductors 38 and 39 form the electrical connection for the winding formed by the electrical conductors on the right hand portion of FIG. 3. Thus, a primary and secondary winding are formed. For transformers requiring a center tap or more than a single primary and secondary winding, suitable conductors 12 may be arrayed to provide bonding pads for interconnection to wire conductors while the conductor pattern on the substrate 10 can facilitate electrical connection to several windings and/or center taps at predetermined positions. Further, the individual windings may be interleaved in any desired pattern by simply connecting the ends of the appropriate flat metal conductors.

The above described hybrid transformer configuration is readily compatible with automated assembly techniques such as automated component loading equipment and pre-programmed wire bonding. Bonding techniques utilized to interconnect the metal wire connectors with the metal connectors formed on the surface of the substrate may be conventional such as thermal compression or ultrasonic bonding thoroughly understood and presently utilized in the electronics industry.

It will be apparent to those skilled in the art that the specific configuration of the core is not critical although the present invention is directed to a closed core magnetic path. Various other modifications will become apparent to those skilled in the art which may be implemented without departing from the spirit and scope of the present invention.

I claim:

1. A hybrid transformer device for use in a hybrid integrated circuit, said hybrid transformer device comprising in combination:
   (a) a non-conductive substrate having a planar surface;
   (b) a plurality of metalized coating conductors formed on said planar surface, each of said conductors having a predetermined length with first and second ends;
   (c) a closed loop magnetic core unit adhesively mounted on said substrate over said metal conductors, said closed loop magnetic core unit being an integral unit formed prior to being adhesively mounted on said substrate, said closed loop magnetic core unit having substantially elevated sides to increase the inductance and power handling capability and lower the losses of said hybrid transformer device;
   (d) insulating means electrically insulating said closed loop magnetic core unit from said metal conductors; and
   (e) a plurality of metal wire bonding conductors of predetermined length each having first and second ends and looping over said closed loop magnetic core unit to form transformer windings, the first end of each of said metal wire bonding conductors being wire bonded to the first end of a different one of said metal conductors, the second end of each of said metal wire bonding conductors being wire bonded to the second end of a different one of said metal conductors.

2. The hybrid transformer device of claim 1 wherein said closed loop magnetic core unit includes a dielectric coating.

3. The hybrid transformer device of claim 2 wherein said dielectric coating forms said insulating means.

4. The combination set forth in claim 1 wherein said closed loop magnetic core unit is a toroidal ferrite core unit.

5. The combination set forth in claim 1 wherein said adhesive material forms a nonrigid bond between said closed loop magnetic core unit and said substrate.

6. The combination set forth in claim 1 wherein said insulating means is formed of a layer of dielectric material formed of a thick film glass between the substrate and said closed loop magnetic core unit.

7. A hybrid transformer device for use in a hybrid integrated circuit, said hybrid transformer device comprising in combination:
   (a) a non-conductive substrate having a planar surface;
   (b) a plurality of metalized coating conductors formed on said planar surface, each of said conductors having a predetermined length with first and second ends;
   (c) a layer of dielectric material on top of and in contact with the major portion of each of said conductors, the ends of each of said conductors extending beyond said dielectric layer;
   (d) a toroidal magnetic core unit coated with dielectric material, said toroidal magnetic core unit having substantially elevated sides to increase the inductance and power handling capability of said hybrid transformer device, said toroidal magnetic core unit being an integral unit formed prior to being adhesively bonded to said layer of dielectric material;
   (e) a layer of adhesive material adhesively bonding said toroidal magnetic core unit to said layer of dielectric material; and
   (f) a plurality of metal wire bonding conductors of predetermined length each having first and second ends and looping over said torroidal magnetic core unit to form transformer windings, the first end of each of said metal wire bonding conductors being wire bonded to the first end of a different one of said metal conductors, the second end of each of said metal wire bonding conductors being wire bonded to the second end of a different one of said metal conductors.

8. The combination set forth in claim 7 wherein said non-conductive substrate is a ceramic material.

9. The combination set forth in claim 7 wherein said layer of adhesive material forms a nonrigid bond between said toroidal magnetic core unit and said layer of dielectric material.

10. The combination set forth in claim 7 wherein said layer of dielectric material is formed of a thick film glass layer.

11. The combination set forth in claim 7 wherein said metal conductors are fire-formed in precious metal on said planar surface.

12. A hybrid transformer device for incorporation into a hybrid integrated circuit, said hybrid transformer device comprising in combination:
(a) a non-conductive substrate having a planar surface;
(b) a plurality of metalized coating conductors formed on said planar surface, each of said conductors having a predetermined length with first and second ends;
(c) a layer of dielectric material on top of and in contact with the major portion of each of said conductors, the ends of each of said conductors extending beyond said dielectric layer;
(d) a toroidal magnetic core unit coated with dielectric material, said toroidal magnetic core unit having substantially elevated sides to increase the inductance and power handling capability of said hybrid transformer device, said toroidal magnetic core unit being an integral unit separately formed prior to use in said hybrid transformer device;
(e) a layer of adhesive material adhesively bonding said toroidal magnetic core unit to said layer of dielectric material; and
(f) a plurality of metal wire bonding conductors of predetermined length each having first and second ends and extending over said toroidal magnetic core unit to form transformer windings, the first end of each of said metal wire bonding conductors being wire bonded to the first end of a different one of said metal conductors, the second end of each of said metal wire bonding conductors being wire bonded to the second end of a metal conductor adjacent said one of said metal conductors.

13. a hybrid transformer device comprising:
(a) a ceramic substrate having a planar surface;
(b) a plurality of metalized coating conductors formed on said planar surface, each of said conductors having a predetermined length with first and second ends and arranged in a pattern whereby each conductor extends substantially radially from an imaginary point on said planar surface;
(c) a ring shaped layer of dielectric material on top of and in contact with said metal conductors with the ends of each of said conductors extending from beneath said dielectric layer;
(d) a toroidal ferrite core unit having substantially elevated sides to increase the inductance and power handling efficiency of said hybrid transformer device;
(e) a layer of nonrigid adhesive material adhesively bonding said toroidal ferrite core unit to said layer of dielectric material with said toroidal ferrite core unit lying flat over said layer of dielectric material; and
(f) a plurality of metal wire bonding conductors of predetermined length each having first and second ends and extending over said toroidal ferrite core unit to form transformer windings, the first end of each of said metal wire bonding conductors being wire bonded to the first end of a different one of said metal conductors, the second end of each of said metal wire bonding conductors being wire bonded to the second end of a metal conductor adjacent said one of said metal conductors.

14. A method of making a hybrid transformer device comprising the steps of:
(a) forming a plurality of metalized coating conductors on a non-conductive substrate, each of the metal conductors having a first end and a second end;
(b) adhesively mounting a closed loop magnetic core unit, having substantially elevated sides to increase the inductance and power handling capability of said hybrid transformer device on the non-conductive substrate by means of a non-rigid adhesive material, such that the first and second ends of said metal conductors remain exposed; and
(c) wire bonding a plurality of metal wire bonding conductors of predetermined length to form transformer windings of said hybrid transformer device by wire bonding one end of each of said metal wire bonding conductors to the first end of a respective one of said metal conductors and looping that wire bonding conductor over a portion of said closed loop magnetic core unit and wire bonding the other end of that metal wire bonding conductor to the second end of an adjacent one of said metal conductors.

15. The method of claim 14 including the step of performing an insulating layer on said substrate, said insulating layer covering a major portion of each of said metal conductors but leaving said first and second ends of each of said metal conductors exposed.

16. The method of claim 14 wherein said wire bonding steps are preprogrammed and are performed utilizing automatic wire bonding techniques.

17. The method of claim 14 wherein said wire bonding is thermal compression wire bonding.

18. The method of claim 14 wherein said wire bonding is ultrasonic wire bonding.

* * * * *